United States Patent [19]

Taniguchi et al.

[11] Patent Number: 4,737,822
[45] Date of Patent: Apr. 12, 1988

[54] IMAGE RECORDING APPARATUS AND METHOD

[75] Inventors: Isao Taniguchi; Minoru Ishikawa, both of Kanagawa, Japan

[73] Assignee: Fuji Photo Film Co., Ltd., Kanagawa, Japan

[21] Appl. No.: 41,028

[22] Filed: Apr. 21, 1987

[30] Foreign Application Priority Data

Apr. 22, 1986 [JP] Japan .................... 61-92924
May 20, 1986 [JP] Japan .................... 61-115463
May 20, 1986 [JP] Japan .................... 61-115464
May 20, 1986 [JP] Japan .................... 61-115465

[51] Int. Cl.$^4$ ............................. G03B 27/52
[52] U.S. Cl. ........................ 355/27; 355/28; 250/318; 250/319
[58] Field of Search ............. 355/27, 28, 3 TR; 250/317.1, 318, 319; 219/216

[56] References Cited

U.S. PATENT DOCUMENTS 4,659,927 4/1987 Tago et al. .................... 250/318
4,660,964 4/1987 Yoshikawa et al. ........... 355/28

FOREIGN PATENT DOCUMENTS 179836 11/1982 Japan .
75247 4/1984 Japan .
275742 12/1986 Japan .
278849 12/1986 Japan .

Primary Examiner—L. T. Hix
Assistant Examiner—D. Rutledge
Attorney, Agent, or Firm—Sughrue, Mion, Zinn, Macpeak and Seas

[57] ABSTRACT

An image recording apparatus employs a photo- and pressure-sensitive heat-developable material having a substrate and a layer formed on the substrate from a material which is photo-sensitive and heat-developable and which enables the developed image to be fixed by a pressure. The apparatus has the following major parts: an exposure device for exposing the material to an original image so as to form a latent image corresponding to the original image on the photo-sensitive material; a heat-developing device for thermally setting the portion of the material corresponding to the latent image thereby immobilizing the image; a pressing transfer device for superposing the material and an image-receiving material in contact with each other and pressing them together; and a conveyor drum defining a path of convey therearound. At least two of the exposure device, the heat-developing device and the pressing transfer device being arranged along the path.

7 Claims, 5 Drawing Sheets

IMAGE RECORDING APPARATUS AND METHOD

BACKGROUND OF THE INVENTION

The present invention relates to an image recording apparatus of the type which employs a photo- and pressure-sensitive heat-developable material which is composed of a substrate and a layer formed on the substrate from a material which is photo-sensitive and which enables a latent image thereon to be developed by heat and the developed image to be fixed by application of pressure, wherein the latent image formed on the photo- and pressure-sensitive heat-developable material formed through an exposure is developed by heating and the developed image is transferred to an image-receiving material having an image-receiving layer as the image-receiving material and the photo- and pressure-sensitive heat-developable material are superposed on each other and pressed together, whereby the image is recorded in the image-receiving material.

An image recording material employing microcapsules containing a photo-ensitive composition has been known. An example of such a recording material is disclosed in Japanese Patent Laid-open No. 179,836/1982. This recording material has a substrate which carries capsules made of a synthetic polymeric resin and containing a vinyl compound, a photopolymerization initiator and a coloring precursor.

In recording an image using this recording material, the material is first exposed so that the microcapsules are hardened in conformity with the form of the image. Then, as the recording material is pressed, the microcapsules which have not been hardened are ruptured so as to release the coloring agent precursor, thus forming a color image. This image recording system provides a high quality of the recorded image with a dry-type simple processing, but suffers from a disadvantage in that the photo-sensitivity is much smaller as compared with the system which makes use of silver halide.

Under this circumstance, the present applicant has proposed, in the specification of Japanese Patent Laid-open No. 275742/1986, a novel recording material which has a high photo-sensitivity and which ensured a high quality of the recorded image with a simple dry-type process. This recording material is a photo- and pressure-sensitive heat-developable material constituted by a carrier and a layer formed on the surface of the carrier, the layer containing at least a photo-sensitive silver halide, reducing agent, polymerizable compound and a color image forming substance, wherein the polymerizable compound and the color image forming substance are confined in common microcapsules.

An image recording method which makes use of this photo- and pressure-sensitive heat-developable material is disclosed in the specification of Japanese Patent Laid-open No. 278849/1986 filed by the same applicant. According to this method, the heat-developable material is first exposed so that a latent image is formed thereon in conformity with the image to be recorded. Then, the material is heated for development so that the polymerizable compound in the area where the latent image exists is polymerized to produce a polymeric compound, thus thermally setting the microcapsules. Then, the material is superposed on an image-receiving material having an image receiving layer capable of receiving the color image forming substance, and is pressed to the image-receiving material so that at least part of the microcapsules having no latent image is ruptured so as to transfer the color image forming substance to the image-receiving material, thereby forming an image on the latter.

However, no image recording apparatus has been proposed hitherto which is capable of automatically performing a series of operation including exposure of the photo- and pressure-sensitive heat-developable material, development of the latent image by heating, superposing the image-receiving material and transfer of the developed image by application of pressure to the superposed materials.

SUMMARY OF THE INVENTION

Accordingly, an object of the present invention is to provide an image recording apparatus which is capable of performing fully automatically a series of operation from exposure to transfer of image to an image-receiving material, by making use of a novel photo- and pressure-sensitive heat-developable material.

To this end, according to the present invention, there is provided an image recording apparatus which employs a photo- and pressure-sensitive heat-developable material having a substrate and a layer formed on the substrate from a material which is photo-sensitive and heat-developable and which enables the developed image to be fixed by a pressure, the apparatus comprising: an exposure device for exposing the material so as to form a latent image corresponding to the original image on the material; a heat-developing device for thermally setting the portion of the material corresponding to the latent image thereby fixing the image; a pressing transfer device for superposing the material and an image-receiving material in contact with each other and pressing them together; and a conveyor drum defining a path of convey therearound, at least two of the exposure device, the heat-developing device and the pressing transfer device being arranged along the path.

Another object of the present invention is to provide an image recording apparatus of the type described above, improved such as to reduce the size of the apparatus as a whole and to reduce the power consumed by the heat-developing device.

To this end, in a preferable aspect of the present invention, the exposure device, the heat-developing device and the pressing transfer device are arranged along a path defined by a common conveyor roll.

In another aspect of the image recording apparatus of the invention, the exposure device and the pressing transfer device are arranged along a path defined by a common conveyor roll.

In still another aspect of the present invention, the exposure device and the heat-developing device are arranged along a path defined by a common conveyor roll.

According to a further form of the invention, the heat-developing device and the pressing transfer device are arranged along a path defined by a common conveyor roll.

DESCRIPTION OF THE PREFERRED EMBODIMENTS

An image recording apparatus in accordance with the first embodiment will be described hereinunder.

Figure 1:
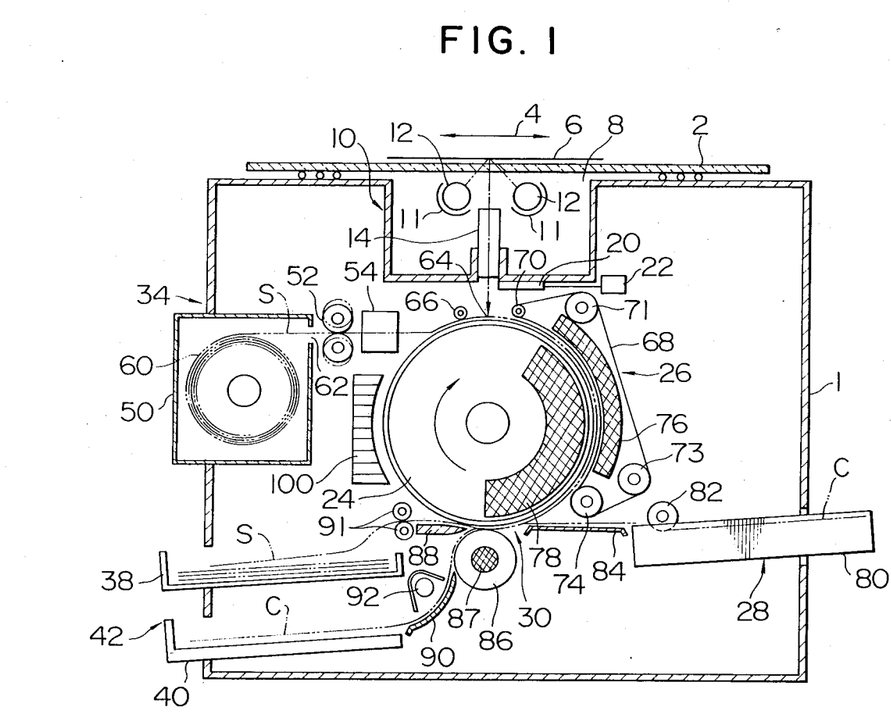
FIG. 1 is an illustration of the construction of a first embodiment of the present invention.

As shown in section in FIG. 1, the apparatus of the first embodiment has a housing 1 on the upper surface of which is disposed an original supporting glass plate 2 for reciprocating movement in the direction of an arrow 4. The glass plate 2 carries an original 6 with its image side directed downward.

The housing 1 houses a conveyor drum 24 of a comparatively large diameter. An exposure device 10, a heat-developing device 26, an image-receiving sheet supplying device 28, a transfer device 30 and a cooling device 100 are arranged around the conveyor drum 100. A photo- and pressure-sensitive heat-developable material (referred to simply as "photo-sensitive material S", hereinunder) supplying device 34, accommodating a roll of an elongated photo-sensitive materials, is disposed in the vicinity of the inlet of a conveyor path defined by the conveyor drum 24, while a delivery device 42 including a photo-sensitive material disposal tray 38 and an image-receiving material delivery tray 40 is disposed in the vicinity of the outlet of the path.

The exposure device 10 includes a plurality of illuminating lamps 12 with reflector mirrors 11 disposed in an illumination chamber 8 formed in an upper portion of the housing 1. These illuminating lamps 12 are adapted for illuminating an original 6 carrying an original image. The illumination chamber 8 also houses a lens array 14 for projecting the original image on the photo-sensitive material S. A shutter device 20 for optically shutting off the illumination chamber 8 from the interior of the housing 1 is disposed under the lens array 14, together with a shutter driving and controlling device 22.

The photo-sensitive material supplying device 34 has a photo-sensitive material cartridge 50 detachably secured to the housing 1, a pair of extraction rolls 52, and a cutting unit 54. The extraction rolls 52 unrolls the photo-sensitive material S from the roll 60 in the photo-sensitive material cartridge 50 through an elongated slit 62 formed in the cartridge 50 and, after being cut in a predetermined size, fed to the conveyor drum 24.

A nip roll 66 is disposed on a portion of the conveyor drum 24 upstream of the exposure position 64 as viewed in the direction of movement of the photo-sensitive material S. The nip roll 66 cooperates with a later-mentioned endless belt 68 so as to keep the photo-sensitive material S in close contact with the conveyor roller 24 when the photo-sensitive material S passes through the exposure position 64.

The heat-developing device 26 includes an endless belt 68 guided by guide rolls 70, 71, 73 and 74 and adapted for conveying the photo-sensitive material S in close contact with the conveyor drum 24, an external heater 76 disposed outside the conveyor drum 24, and an internal heater 78 disposed inside the conveyor drum 24. The external heater 76 and the internal heater 78 heat the photo-sensitive material S so as to develop a latent image carried by the latter.

The image-receiving material supplying device 28 has an image-receiving material tray 80 in which stacked are a plurality of sheets of image-receiving material C, an image-receiving material extraction roll 82 provided on the tray 80, and a guide plate 84. The image-receiving material supplying device 28 is adapted to supply the sheets of the image-receiving material C one-by-one to the transfer device 30 such that the sheet of the image-receiving material C is superposed to the photo-sensitive material S. The image-receiving material C has a width which is smaller than that of the photo-sensitive material S so that it can easily be separated from the photo-sensitive material S.

The transfer device 30 has a transfer fixing roll 86 pressed to the conveyor drum 24, a separation guide plate 88, a guide 90, a pair of nip rolls 91, and a fixing ultraviolet lamp 92 with a reflector mirror. The transfer fixing roll 86 is provided in the center thereof with a heater 87 so as to heat the photo-sensitive material S and the image-receiving material superposed to each other and to press these materials at a pressure of about 150 kg/cm$^2$, thus effecting transfer and primary fixing of the image. The separation guide plate 88 is adapted for separating the photo-sensitive material S and the image-receiving material C from each other by making use of the fact that both widthwise ends of the photo-sensitive material S project beyond the widthwise ends of the image-receiving material C, and guides the photo-sensitive material S to the photo-sensitive material disposal tray 38 via the nip roll 91. Meanwhile, the image-receiving material C advances while being guided by the guide plate 90 and is irradiated with the ultraviolet rays from the ultraviolet lamp 92 thus effecting secondary fixing. The image-receiving material C after the secondary fixing is sent to the tray 40 by means of the guide plate 90.

The cooling device 100 is disposed in the vicinity of the conveyor drum 24 at a position between the delivery device 42 and the cutting unit 54. The cooling device 100 is adpated for cooling the conveyor drum 24 which has been heated by the transfer device 30 so as to prevent any overheating of the photo-sensitive material S by the conveyor drum 24 at the exposure position 64.

The image recording apparatus further has a controller (not shown) operatively connected to the glass plate 2, photo-sensitive material extraction roll 52, exposure lamp 12, shutter driving and controlling device 22, conveyor drum 24 and the image-receiving material extraction roll 82. The image recording apparatus performs the following operation under the control of the controller.

As a copy button (not shown) is depressed, the photo-sensitive material S is extracted by the extraction roll 52 and is cut into separate sheet by the cutting unit 54. The cut sheet of the photo-sensitive material S is then placed on the conveyor drum 24 and conveyed to the exposure position 64.

Then, the exposure lamps 12 light up to illuminate the original 6 and the shutter device 20 which has been closed is opened so that the original image is projected at the exposure position 64 through the lens array 14. The original 6 and the conveyor drum 24 are moved and rotated so as to be synchronized with each other and the photo-sensitive material S is exposed to the image on the original 6, thus forming a latent image on the photo-sensitive material S. After the exposure, the photo-sensitive material S is heated by the external heater 76 and the internal heater 78, whereby the latent image on the photo-sensitive material S is developed.

Meanwhile, the image-receiving material extraction roll 52 operates in synchronism with the convey of the photo-sensitive material S so as to extract and superpose a sheet of the image-receiving material C on the photo-sensitive material S which has been developed. This is conducted such that the breadthwise center of the image-receiving material C is aligned with the breadthwise center of the photo-sensitive material S which has a greater width than the image-receiving material C.

The internal heater 78 extends to the transfer position 30, so that the photo-sensitive material S and the image-receiving material C superposed on each other and brought to the transfer position 30 are pressed to each other by the transfer fixing roll 86 under application of heat from the internal heater 78, whereby the transfer and the primary fixing are completed. Then, the separation guide plate 88 pushes the end of the photo-sensitive material S projecting laterally from the image-receiving material C towards the conveyor drum 24, thereby separating the image-receiving material C from the photo-sensitive material S and allowing the photo-sensitive material S to be sent to the photo-sensitive material disposal tray 38. The image-receiving material C after the transfer and the primary fixing is irradiated with ultraviolet rays from the ultraviolet lamp 92, so that the secondary fixing is effected to fix the image on the image-receiving material C which is then sent to the image-receiving material delivery tray 40.

The outer periphery of the conveyor drum 24 is locally cooled by the cooling device 100 after the transfer conducted by the transfer device 30, so that the photo-sensitive material S sent to the exposure position 64 by the conveyor roll 24 is exposed at an appropriate temperature.

Figure 4:
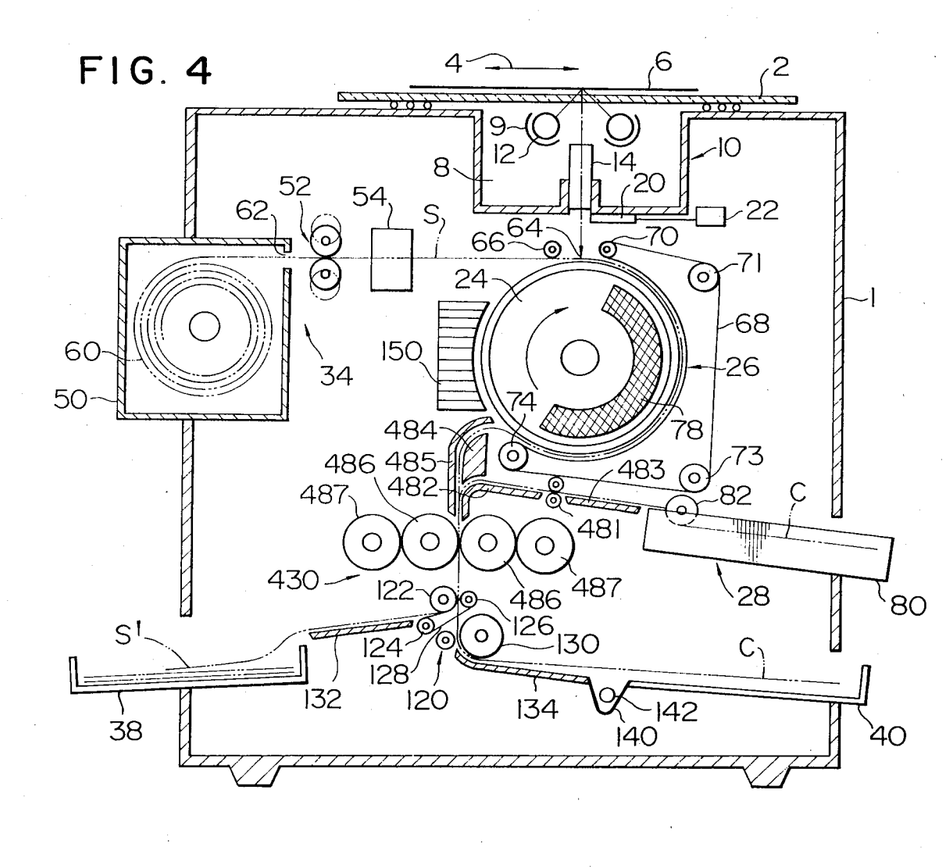
FIG. 4 is an illustration of the construction of a fourth embodiment of the present invention.

In this fourth embodiment, there are provided guide members 484, 485 for guiding the developed photo-sensitive materials S to the transfer device 430 and guide members 482, 483 and a pair of transfer rollers 481 for guiding the image-receiving material C thereto.

Figure 2:
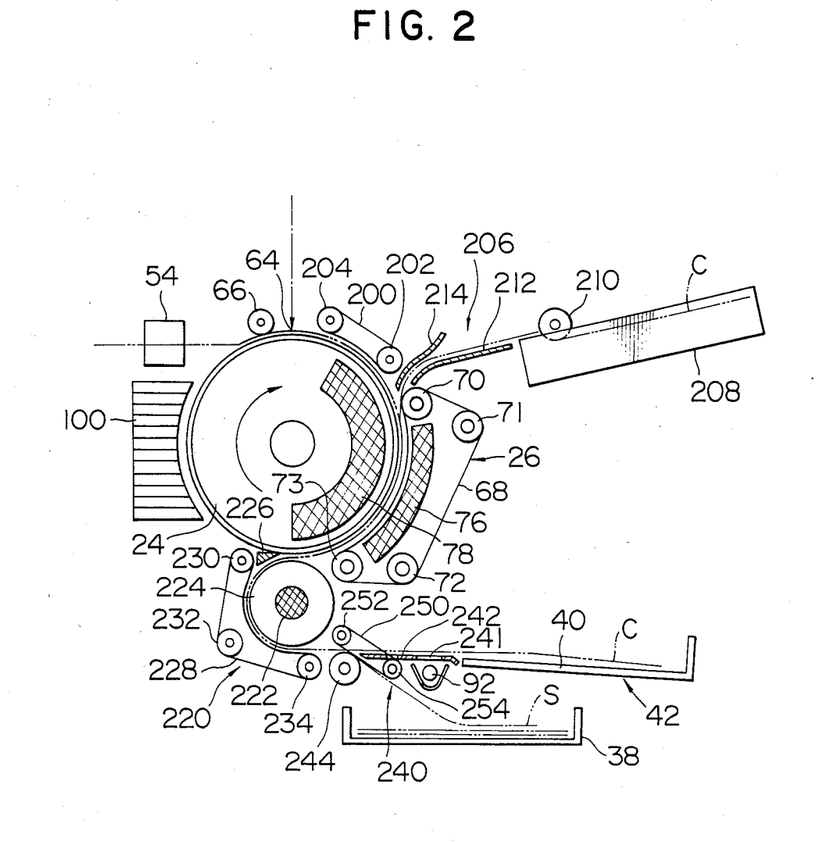
FIG. 2 is an illustration of the construction of a second embodiment.

FIG. 2 shows a second embodiment of the image recording apparatus in accordance with the present invention. In FIG. 2, the same reference numerals are used to denote the same parts or members as those in the first embodiment, and description of such parts or members is omitted to avoid duplication of the explanation.

An endless belt 200 guided by guide rolls 202, 204 operates so as to keep the photo-sensitive material S in close contact with the conveyor roll 24.

An image-receiving material supplying device 206 is disposed in front of the endless belt 200. The image-receiving material supplying device 206 includes an image-receiving material tray 208, image-receiving material extraction roll 210 and guide plates 212, 214, and is adapted for supplying sheets of the image-receiving material C one-by-one onto the exposed photo-sensitive material S carried by the conveyor drum 24. Thus, the heat-developing device 26 in this embodiment heats both the photo-sensitive material S and the image-receiving material C superposed thereon, in contrast to the first embodiment in which the exposed photo-sensitive material S solely is heated.

A transfer device 220 disposed downstream of the heat-developing device 26 includes a transfer fixing roll 224 provided with a central heater 222, a guide member 226, guide rolls 230, 232 and 234 which are adapted for guiding the endless belt 228 in pressure contact with the transfer fixing roll 224, and a separation device 240. The separation device 240 is composed of a guide plate 242 having an opening 241 for passing ultraviolet rays emitted from the ultraviolet lamp 92 and adapted for guiding the image-receiving material C, a separation roll 244, a separation endless belts 250 for pressing the widthwise ends of the photo-sensitive material S projecting beyond the image-receiving material C onto the separation roll 244 so as to introduce the photo-sensitive material S to the photo-sensitive material disposal tray 38, and guide rolls 252, 254 for guiding the separation endless belt 250.

In this fourth embodiment, there are provided guide members 484, 485 for guiding the developed photo-sensitive materials S to the transfer device 430 and guide members 482, 483 and a pair of transfer rollers 481 for guiding the image-receiving material C thereto.

Figure 3:
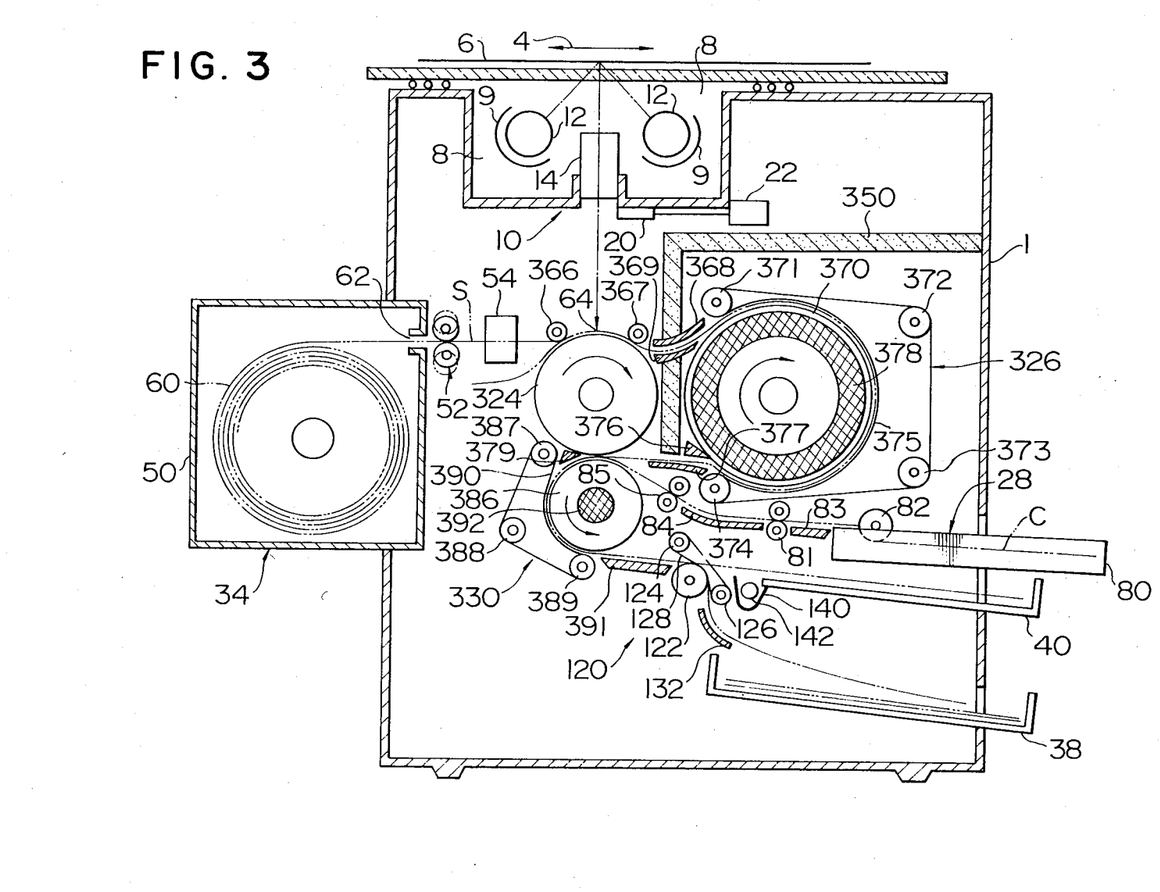
FIG. 3 is an illustration of the construction of a third embodiment of the present invention.

A third embodiment of the present invention will be described hereinunder with reference to FIG. 3. The second embodiment is basically the same as the first embodiment shown in FIG. 1 except that a separate heat-developing device is used independently of the conveyor roller, so that only the exposure device and the transfer device are arranged along the path defined by a common conveyor roll. Thus, the same reference numerals are used to denote the same parts or members as those used in the first embodiment, and detailed description of such parts or members is omitted.

The housing 1 accommodates the following portions or devices which are arranged in the mentioned order in the direction of movement of the photo-sensitive material S: a photo-sensitive material supplying device 34, an exposure device 10 for exposing the photo-sensitive material S to an original image, a heat-developing device 326 for developing an image on the photo-sensitive material S, an image-receiving material supply device 28 for superposing the image-receiving material C onto the photo-sensitive material S, a transfer device 330, a separation device 120, and an image-receiving material delivery tray 40 and a photo-sensitive material disposal tray 38. The exposure device 10 and the transfer device 330 are arranged around a conveyor drum 324 which also is disposed in the housing 1.

Nip rolls 366 and 367 are disposed in contact with the conveyor drum 324 downstream and upstream from the exposure position 64, respectively. These nip rolls 366 and 367 cooperate with each other in keeping the photo-sensitive material S in close contact with the conveyor drum 324.

The heat-developing device 326 has upper and lower guide plates 368, 369 for guiding the exposed photo-sensitive material S, a developing drum 370, an endless belt 375 guided by guide rolls 371, 372, 373 and 373 and held in pressure contact with the developing drum 370, a separator plate 376 for separating the developed photo-sensitive material S from the developing drum 370, a guide plate 377 for guiding the separated photo-sensitive material S to the transfer device 330, and a heater 378 disposed in the developing drum 370. The heat-developing device 326 is adapted for pressing the photo-sensitive material S onto the developing drum 370 by the endless belt 375 and for heating the same by the heat generated by the heater 378 thereby developing the latent image carried by the photo-sensitive material S.

The transfer device 330 has a transfer roll 386 pressed onto the conveyor drum 324, a separator plate 379 for separating the superposed photo-sensitive material S and the image-receiving material C from the conveyor drum 324 after the transfer of the image, a belt 390 guided by guide rolls 387, 388 and 389 and pressed onto the transfer roll 386, and a guide plate 391. The transfer device 330 further has a heater 392 disposed in the transfer roll 386. The transfer roll 386 exerts a pressure of about 150 kg/cm$^2$ to the superposed photo-sensitive material S and the image-receiving material C while heat is applied to the same from the heater 392, thus attaining a high efficiency of transfer of the image. At the same time, the belt 390 presses the superposed photo-sensitive material S and the image-receiving material C onto the transfer roll 386, thus thermally fixing the image transferred to the image-receiving material C.

The separation device 120 is composed of a separation roll 122, a separation belt 128 guided by guide rolls 124, 126, and a guide plate 132. The separation belt 128 is adapted for pressing the widthwise marginal end of the photo-sensitive material S projecting beyond the image-receiving material C onto the separation roll 122, thereby separating the photo-sensitive material S and the image-receiving material C from each other. The image-receiving material C separated by the separation device 120 is then irradiated with ultraviolet lamp 142 so that the transferred image is finally fixed, and is then sent to the image-receiving paper delivery tray 40.

In the third embodiment, a heat insulating wall 350 is provided between the exposure device 10 and the heat-developing device 326 so as to enhance the preservation of heat in the heat-developing device 326, thereby minimizing the loss of the heat energy, while preventing the photo-sensitive material S from being heated above a predetermined allowable temperature when exposed by the exposed device 10.

A fourth embodiment of the present invention will be described hereinunder with reference to FIG. 4. The fourth embodiment is basically the same as the foregoing embodiments so that the following description will be concentrated only on the points which discriminate the fourth embodiment from the preceding embodiments. Thus, the same reference numerals are used in FIG. 4 to denote the same parts or members as those used in FIGS. 1 to 3 showing the first to third embodiments.

The image recording apparatus of the fourth embodiment has the following parts or devices which are arranged in the housing 1 in the mentioned order along the path of movement of the photo-sensitive material S: a photo-sensitive material supplying device 34, a heat-developing device 26, an image-receiving material supplying device 28 for supplying a sheet of image-receiving material and superposing the same on the photo-sensitive materials, transfer device 430, a separation device 120, and an image-receiving material delivery tray 40 and a photo-sensitive material disposal tray 38. In this embodiment, the exposure device 10, heat-developing device 26 and a cooling device 150 are disposed along the path determined by the conveyor drum 24 having a comparatively large diameter and disposed in the housing 1.

In this fourth embodiment, the heat-developing device 26 has the same construction as that in the first embodiment, except that the external heater 76 is omitted, as in the case of the third embodiment.

In this fourth embodiment, there are provided guide members 484, 485 for guiding the developed photo-sensitive materials S to the transfer device 430 and guide members 482, 483 and a pair of transfer rollers 481 for guiding the image-receiving material C thereto.

Thus, the fourth embodiment of the invention enables the image recording apparatus to have a reduced size, thanks to the feature that the exposure device and the heat-developing device are arranged around the conveyor drum 24.

A fifth embodiment will be described hereinunder with reference to FIG. 5. This fifth embodiment is basically the same as the preceding embodiments so that the description will be focused mainly on points which discriminate this embodiment from other embodiments. Thus, in FIG. 5, the same reference numerals are used to denote the same parts or members as those used in the preceding embodiments, and detailed description thereof is omitted.

Figure 5:
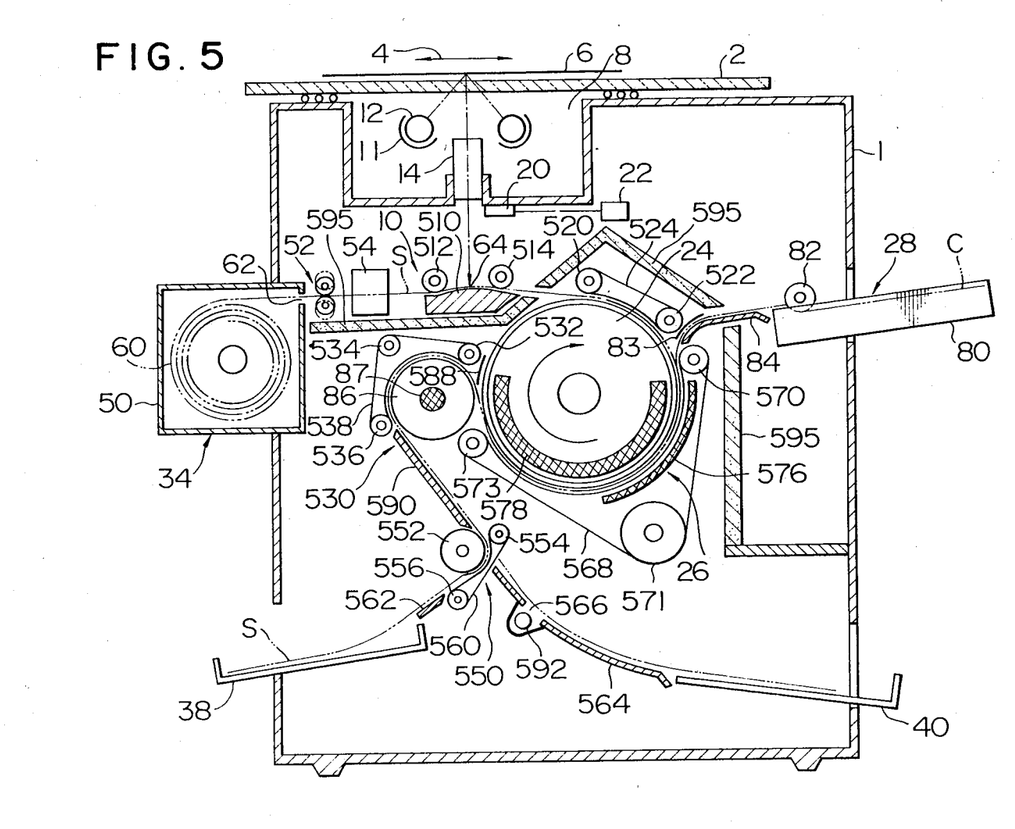
FIG. 5 is an illustration of the construction of a fifth embodiment of the present invention.

Referring to FIG. 5, a photo-sensitive material support 510 is located at the image exposure position where the image is focused by the lens array 14. Supply rolls 512 and 514 are disposed on the downstream and upstream sides of the position 64 where the image is formed.

In this fifth embodiment, the image-receiving material supply device 28, heat-developing device 26 and the pressing transfer device 30 are arranged around the conveyor drum 24 disposed in the housing 1. The pressing transfer device 26 includes an endless belt 524 guided by guide rolls 520, 522 and adapted for transferring the photo-sensitive material S in close contact with the conveyor drum 24, an endless belt 568 guided by guide rolls 570, 571 and 573 and adapted for pressing the photo-sensitive material S and the image-receiving material C superposed thereon in close contact with the conveyor drum 24, an external heater 576 disposed externally of the conveyor drum 24, and an internal heater 578 disposed inside the conveyor roll 24. These heaters 576 and 578 are adapted for heating the photo-sensitive material S thereby developing the image formed on the photo-sensitive material S.

On the other hand, the pressing transfer device 30 is composed of a transfer roller 86 pressed to the conveyor drum 24, a separation guide plate 588, an endless belt 538 guided by the guide rolls 532, 534 and 536, and a guide 590. The transfer roll 86 is provided in the center thereof with a heater 87. The transfer roll 86 presses the photo-sensitive material S after development and the image-receiving material C superposed to each other at a pressure of about 150 kg/cm$^2$, while applying heat to the same, thereby allowing the developed image to be transferred to the image-receiving material C.

A separation device 550, photo-sensitive material disposal tray 38 and an image-receiving material delivery tray 40 are disposed under the pressing transfer device 30. A guide plate 162 is disposed downstream from an endless separation belt 560 supported by rollers 554, 556 so that the photo-sensitive material S separated by the belt 560 is sent to the disposal tray 38 along the guide plate 562. Meanwhile, the image-receiving material C after separation is sent to the delivery tray 40 along a guide plate 564 disposed downstream of a separation roll 552. The photo-sensitive surface of the image-receiving material C which is being conveyoed along the guide plate 564 is irradiated with ultraviolet rays from an ultraviolet lamp 592 through an aperture 566 formed in the guide plate 564, whereby the transferred image is finally fixed.

A heat insulating wall 595 is disposed between the exposure device 10 and the conveyor drum 24 and around the heat-developing device 26 so as to keep the photo-sensitive material S before the exposure from heat, while preserving heat in the heat-developing device 26.

In this fifth embodiment also, the size of the apparatus is remarkably reduced thanks to the feature that the heat-developing device and the pressing transfer device are disposed along a path defined by a common conveyor drum. In addition, the heat applied during the heat-development is effectively utilized in the transfer of image by application of pressure, by virtue of the arrangement that the heat-developing device and the pressing transfer device are disposed in the close proximity of each other.

Although the invention has been described through its specific forms, the described embodiments are only illustrative and various changes and modifications may be imparted thereto.

For instance, the present invention is applicable also to the cases where the photo-sensitive material itself has an image-receiving layer on which the developed image is to be fixed by application of pressure, unlike the described embodiments in which the developed image is transferred to a separate image-receiving material having an image-receiving layer. In such a case, needless to say, the image-receiving material supplying device and the photo-sensitive material disposal tray are dispensed with.

What is claimed is:

1. An image recording apparatus which employs a photo- and pressure-sensitive heat-developable material having a substrate and a layer formed on said substrate from a material which is photo-sensitive and heat-developable and which enables the developed image to be fixed by a pressure, said apparatus comprising:
   an exposure device for exposing said material to an original image so as to form a latent image corresponding to said original image on said material;
   a heat-developing device for thermally setting the portion of said material corresponding to said latent image thereby immobilizing said image;
   a pressing transfer device for superposing said photo-sensitive material and an image-receiving material in contact with each other and pressing them together; and
   a conveyor drum defining a path of conveyance therearound, at least two of said exposure device, said heat-developing device and said pressing transfer device being arranged along said path.

2. An image recording apparatus according to claim 1, wherein said material is composed of a substrate and a layer formed on said substrate from a composition which contains a photo-sensitive silver halide, a reducing agent, a polymerizable compound and a color-image forming material, and wherein at least said polymerizable compound and said color-image forming material are charged in common capsules.

3. An image recording apparatus according to claim 1, wherein said heat-developing device is adapted to cause said polymerizable compound in said capsules located in the area corresponding to said latent image, thus thermally setting said microcapsules in said area.

4. An image recording apparatus according to claim 1, wherein said exposure device, said heat-developing device and said press transfer device are disposed along said path defined by said conveyor drum.

5. An image recording apparatus according to claim 1, wherein said exposure device and said pressing transfer device are disposed along said path defined by said conveyor drum.

6. An image recording apparatus according to claim 1, wherein said exposure device and said heat-developing device are disposed along said path defined by said conveyor drum.

7. An image recording apparatus according to claim 1, wherein said heat-developing device and said pressing transfer device are disposed along said path defined by said conveyor drum.

* * * * *